(12) United States Patent
Park et al.

(10) Patent No.: US 8,890,138 B2
(45) Date of Patent: Nov. 18, 2014

(54) OPTICAL TOUCH PANEL AND METHOD OF FABRICATING THE SAME

(75) Inventors: Jae-chul Park, Suwon-si (KR); I-hun Song, Seongnam-si (KR); Chang-jung Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 702 days.

(21) Appl. No.: 12/929,301

(22) Filed: Jan. 13, 2011

(65) Prior Publication Data

US 2011/0272689 A1    Nov. 10, 2011

(30) Foreign Application Priority Data

May 6, 2010    (KR) .................. 10 2010 0042587

(51) Int. Cl.
| | |
|---|---|
| *H01L 31/0248* | (2006.01) |
| *H01L 27/12* | (2006.01) |
| *G06F 3/041* | (2006.01) |
| *G02F 1/1333* | (2006.01) |
| *G06F 3/042* | (2006.01) |
| *G02F 1/1368* | (2006.01) |

(52) U.S. Cl.
CPC ........ *G02F 1/13338* (2013.01); *H01L 27/1225* (2013.01); *G06F 3/0412* (2013.01); *G06F 3/042* (2013.01); *G02F 1/1368* (2013.01)
USPC ............. 257/43; 257/414; 257/428; 257/431; 257/432

(58) Field of Classification Search
USPC ............... 257/43, 59, 72, 291, 292, 294, 296, 257/347, 350, 401
See application file for complete search history.

(56) References Cited

U.S. PATENT DOCUMENTS

| | | | |
|---|---|---|---|
| 6,570,197 B2 * | 5/2003 | Joo ............................... 257/222 |
| 2009/0140243 A1 * | 6/2009 | Kim et al. ....................... 257/43 |
| 2010/0006834 A1 * | 1/2010 | Kim et al. ....................... 257/43 |
| 2010/0155731 A1 * | 6/2010 | Sun et al. ......................... 257/59 |
| 2011/0198586 A1 * | 8/2011 | Inoue et al. ..................... 257/43 |
| 2011/0227878 A1 * | 9/2011 | Makita .......................... 345/175 |
| 2012/0223316 A1 * | 9/2012 | Kanzaki et al. ................. 257/72 |

* cited by examiner

*Primary Examiner* — Matthew W Such
*Assistant Examiner* — David Spalla
(74) *Attorney, Agent, or Firm* — Harness, Dickey & Pierce, P.L.C.

(57) ABSTRACT

An optical touch panel may be used remotely to control a large-sized display device. According to a method of fabricating the optical touch panel, an optical sensor transistor for sensing light and a switch transistor for drawing data can be formed together on the same substrate by using a relatively simple process. The optical touch panel may include an optical sensor transistor and a switch transistor. The optical sensor transistor may be configured to sense light and the switch transistor may be configured to draw data from the optical sensor transistor. The optical sensor transistor may include a light sensitive oxide semiconductor material as a channel layer. The switch transistor may include a non-light sensitive oxide semiconductor material as a channel layer.

19 Claims, 11 Drawing Sheets

OPTICAL TOUCH PANEL AND METHOD OF FABRICATING THE SAME

CROSS-REFERENCE TO RELATED APPLICATIONS

This application claims priority under 35 U.S.C. §119 to Korean Patent Application No. 10-2010-0042587, filed on May 6, 2010, in the Korean Intellectual Property Office (KIPO), the entire contents of which are herein incorporated by reference.

BACKGROUND

1. Field

Example embodiments relate to an optical touch panel and a method of fabricating the same, and more particularly, to an optical touch panel including a light-sensitive oxide semiconductor transistor and a method of fabricating the same.

2. Description of the Related Art

Touch screens are devices that directly receive input data when a display screen thereof is touched by a hand or an object, determine the location of the touch, and perform specific processing in response to the touch. A touch screen may be formed by attaching a touch panel to a general display panel. A touch panel can be classified into a resistive overlay type, a capacitive overlay type, a surface acoustic wave (SAW) type, an infrared beam type, and a piezoelectric type. From among these types, the resistive overlay type touch panel has been widely used. In line with the technological advancements, various types of touch panels have been embodied, and thus the prices thereof have decreased, thereby increasing the use of touch screens. Recently, an in-cell type touch screen, in which a touch sensor is integrally formed in a pixel of a display panel, has been developed.

A conventional touch screen needs to be directly touched by a human's hand or a pen. Accordingly, a resistive overlay type touch panel, which is the most widely used type of touch panel, has a problem in that upper and lower conductive layers may be damaged due to external pressure. Although the resistive overlay type touch panel may have an excellent sensing effect, a user needs to be relatively close to the touch panel. Accordingly, a touch panel can be used only in a small-sized or middle-sized display, for example, a general desktop computer, a notebook computer, or a portable device, for example, a mobile phone or a navigation device. However, as display devices become larger, it may be difficult to use a touch panel when a distance between the display device and a user is increased.

SUMMARY

Example embodiments provide an optical touch panel that may include a light-sensitive oxide semiconductor transistor. The light-sensitive oxide semiconductor transistor may allow the optical touch panel to be remotely operated.

Example embodiments also provide a method of fabricating an optical touch panel. In example embodiments, an optical sensor transistor for sensing light may be formed together with a switch transistor for drawing data by using a relatively simple process.

Additional aspects will be set forth in part in the description which follows and, in part, will be apparent from the description, or may be learned by practice of example embodiments.

In accordance with example embodiments, an optical touch panel may include an optical sensor transistor and a switch transistor. The optical sensor transistor may be configured to sense light and the switch transistor may be configured to draw data from the optical sensor transistor. In example embodiments, the optical sensor transistor may include a light sensitive oxide semiconductor material as a channel layer. In example embodiments, the switch transistor may include a non-light sensitive oxide semiconductor material as a channel layer. In example embodiments, the optical sensor transistor and the switch transistor may be on a same substrate.

In accordance with example embodiments, a method of fabricating an optical touch panel may include forming first and second gate patterns on a substrate, forming a gate insulating layer on the substrate and the first and second gate patterns, forming a first channel layer on the gate insulating layer so as to face the first gate pattern, forming a second channel layer on the gate insulating layer in a location facing the second gate pattern and on at least an upper surface of the first channel layer, forming a source/drain pattern at both sides of the first channel layer and at both sides of the second channel layer, and forming a transparent insulating layer on the source/drain pattern and the first and second channel layers.

In accordance with example embodiments, a method of fabricating an optical touch panel may include forming first and second gate patterns on a substrate, forming a gate insulating layer on the substrate and first and second gate patterns, forming a first channel layer on the gate insulating layer so as to face the first gate pattern, forming a source/drain pattern on the gate insulating layer and first channel layer, forming a second channel layer so as to penetrate the source/drain pattern and to face the second gate pattern, exposing a surface of the first channel layer by partially removing the source/drain pattern formed on the first channel layer, and forming a transparent insulating layer on the source/drain pattern and first and second channel layers.

In accordance with example embodiments, an optical touch panel may include an optical sensor transistor for sensing light and a switch transistor for drawing data from the optical sensor transistor. In example embodiments the optical sensor transistor and the switch transistor may be formed on the same substrate and the optical sensor transistor may include an oxide semiconductor material, which may be relatively sensitive to light, as a channel layer, and the switch transistor may include an oxide semiconductor material, which may not be sensitive to light, as a channel layer.

The optical touch panel may include a substrate, a first gate pattern and a second gate pattern that are disposed on the substrate, a gate insulating layer disposed so as to cover the substrate and the first and second gate patterns, a first channel layer that is partially disposed on the gate insulating layer so as to face the first gate pattern, a second channel layer that is partially disposed on the gate insulating layer so as to face the second gate pattern, a source/drain pattern disposed at both sides of the first channel layer and at both sides of the second channel layer, and a transparent insulating layer disposed so as to cover the source/drain pattern and the first and second channel layers, wherein the second channel layer is further disposed so as to surround at least an upper surface of the first channel layer, and a part of the second channel layer formed on the first channel layer is removed so as to expose the first channel layer.

The first channel layer may be disposed so as to face the first gate pattern and the first channel layer may be formed of an oxide semiconductor material, which may be relatively sensitive to light, as a channel layer of the optical sensor transistor, and the second channel layer may be disposed so as to face the second gate pattern and the second channel layer may be formed of an oxide semiconductor material, which is not relatively sensitive to light, as a channel layer of the switch transistor.

On the contrary, the first channel layer may be disposed so as to face the first gate pattern and the first channel layer may be formed of an oxide semiconductor material, which is not relatively sensitive to light, as a channel layer of the switch transistor, and the second channel layer may be disposed so as to face the second gate pattern and the second channel layer may be formed of an oxide semiconductor material, which may be relatively sensitive to light, as a channel layer of the optical sensor transistor.

The oxide semiconductor material, which may be relatively sensitive to light, may comprise ZnO, InO, SnO, ZnInO, ZnSnO, InSnO or their mixture with at least one material selected from the group consisting of Hf, Y, Ta, Zr, Ti, Cu, Ni, Cr, In, Ga, Al, Sn, Mg and Lanthanide, and the oxide semiconductor material, which may not be relatively sensitive to light, may comprise gallium indium zinc oxide (GIZO).

The source/drain pattern may partially cover upper surfaces of the first channel layer and the second channel layer, and a second channel layer may further be disposed between the source/drain pattern and the first channel layer.

The optical touch panel may include a substrate, a first gate pattern and a second gate pattern that are disposed on the substrate, a gate insulating layer may be disposed so as to cover the substrate and the first and second gate patterns, a first channel layer may be partially disposed on the gate insulating layer so as to face the first gate pattern, a second channel layer may be partially disposed on the gate insulating layer so as to face the second gate pattern, a source/drain pattern may be disposed at both sides of the first channel layer and at both sides of the second channel layer, and a transparent insulating layer may be disposed so as to cover the source/drain pattern and the first and second channel layers, wherein the source/drain pattern may cover edges of the first channel layer, and the second channel layer extends to an upper surface of the source/drain pattern.

In accordance with example embodiments, a method of fabricating an optical touch panel may include forming first and second gate patterns on a substrate, forming a gate insulating layer on the entire substrate and first and second gate patterns, forming a first channel layer on the gate insulating layer so as to face the first gate pattern, forming a second channel layer in a location facing the second gate pattern and on at least an upper surface of the first channel layer, forming a source/drain pattern at both sides of the first channel layer and at both sides of the second channel layer, and forming a transparent insulating layer on the entire source/drain pattern and first and second channel layer.

The first channel layer may be formed of an oxide semiconductor material that is relatively sensitive to light, and the second channel layer may be formed of an oxide semiconductor material that is not relatively sensitive to light.

On the contrary, the first channel layer may be formed of an oxide semiconductor material that is not relatively sensitive to light, and the second channel layer may be formed of an oxide semiconductor material that is relatively sensitive to light.

The forming of the second channel layer may include forming a material for forming the second channel layer on the entire gate insulating layer and first channel layer, and removing the material for forming the second channel layer, except for the location facing the second gate pattern and at least the upper surface of the first channel layer on the gate insulating layer.

The forming of the source/drain pattern may include forming a conductive metal or a conductive metal oxide on the entire gate insulating layer and first and second channel layer, and exposing the upper surface of the first channel layer and an upper surface of the second channel layer to the outside by partially removing the conductive metal or the conductive metal oxide formed on the first and second channel layers.

In the partially removing of the conductive metal or the conductive metal oxide, a part of the second channel layer formed on the first channel layer may be removed.

In accordance with example embodiments, a method of fabricating an optical touch panel may include forming first and second gate patterns on a substrate, forming a gate insulating layer on the entire substrate and first and second gate patterns, forming a first channel layer on the gate insulating layer so as to face the first gate pattern, forming a source/drain pattern on the entire gate insulating layer and first channel layer, forming a second channel layer so as to penetrate the source/drain pattern and to face the second gate pattern, exposing a surface of the first channel layer to the outside by partially removing the source/drain pattern formed on the first channel layer, and forming a transparent insulating layer on the entire source/drain pattern and first and second channel layers.

The forming of the second channel layer may include forming a hole so as to expose the gate insulating layer by partially removing the source/drain pattern in a location facing the second gate pattern; and filling the second channel layer in the hole.

The second channel layer may extend to an upper surface of the source/drain pattern around the hole.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1A:
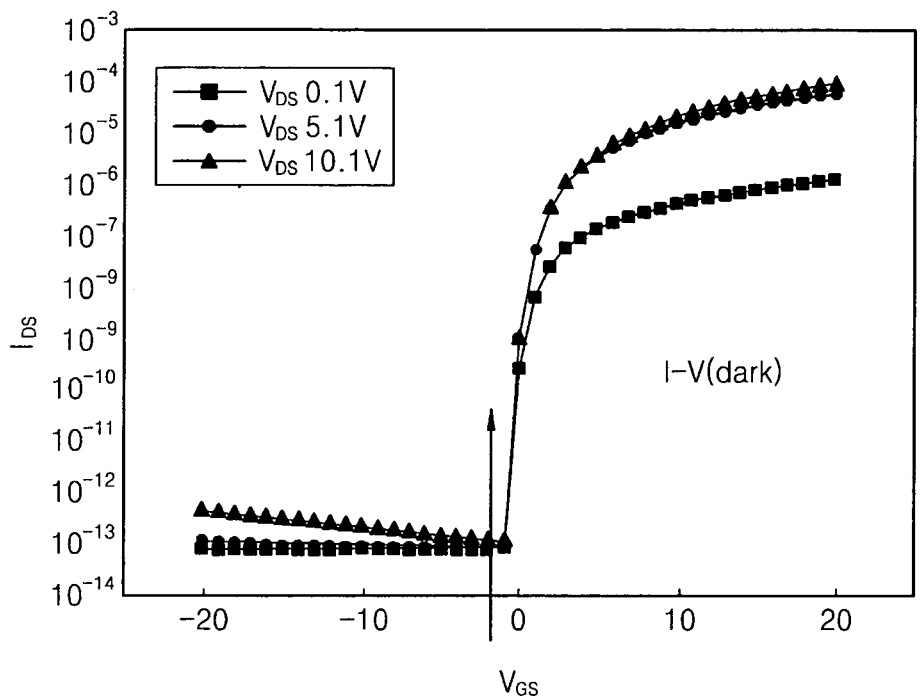
FIGS. 1A and 1B are graphs illustrating operation characteristics of a light-sensitive oxide semiconductor transistor, according to example embodiments.

Example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Hereinafter, example embodiments will be described in detail with reference to the attached drawings. The same reference numerals in the drawings denote the same element. In the drawings, the thicknesses of layers and regions are exaggerated for clarity.

A light-sensitive oxide semiconductor transistor is an oxide semiconductor transistor whose threshold voltage may vary according to a wavelength of or the amount of incident light. Thus, the light-sensitive oxide semiconductor transistor may be used as an optical sensor. The light-sensitive oxide semiconductor transistor may include a light-sensitive oxide semiconductor as a channel material. For example, since charges may be easily generated (i.e. depletion hardly occurs) in the light sensitive material when exposed to light, the threshold voltage of the light-sensitive oxide semiconductor transistor may be lowered. In example embodiments, the channel material may be a ZnO-based oxide semiconductor material. The ZnO-based oxide semiconductor material may include ZnO or a mixture including ZnO and at least one material selected from the group consisting of Hf, Y, Ta, Zr, Ti, Cu, Ni, Cr, In, Ga, Al, Sn, Mg and Lanthanide. Examples of the ZnO-based oxide semiconductor material include ZnO, TaZnO, and InZnO (IZO). Further, the channel material may also include InO, SnO, ZnInO, ZnSnO, InSnO and their mixture with at least one material selected from the group consisting of Hf, Y, Ta, Zr, Ti, Cu, Ni, Cr, In, Ga, Al, Sn, Mg and Lanthanide.

Figure 1B:
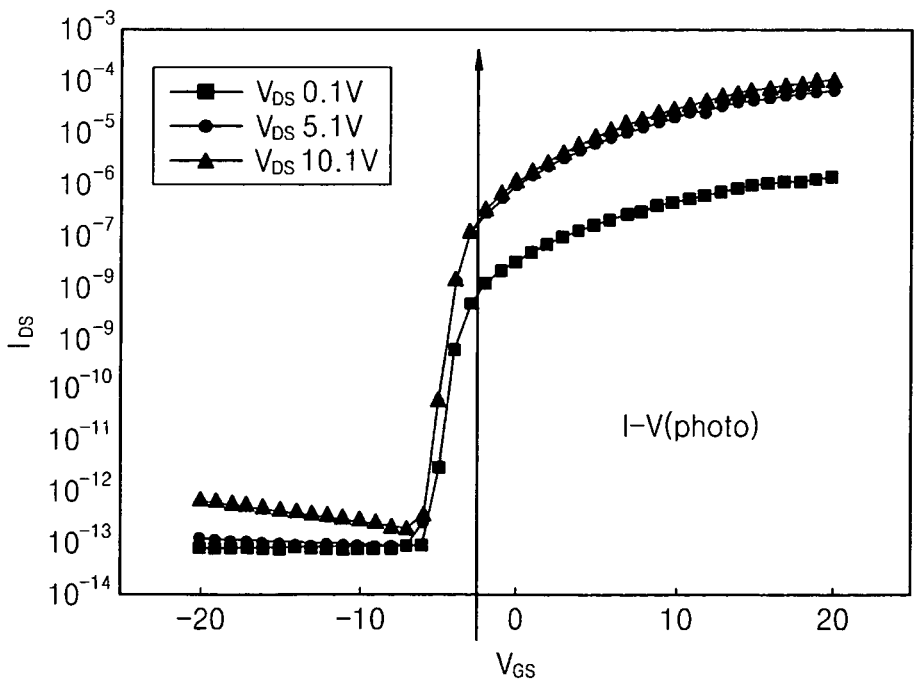

FIGS. 1A and 1B are graphs illustrating operation characteristics of a light-sensitive oxide semiconductor transistor, according to example embodiments. FIG. 1A is a graph illustrating an $I_{DS}$-$V_{GS}$ characteristic when light is not incident on the light-sensitive oxide semiconductor transistor, wherein $I_{DS}$, represents drain-source current, $V_{DS}$ represents the drain-source voltage, and $V_{is}$ represents the gate-source voltage. FIG. 1B is a graph illustrating an $I_{DS}$-$V_{Gs}$ characteristic when light is incident on the light-sensitive oxide semiconductor transistor. According to the graphs of FIGS. 1A and 1B, when light is incident on the light-sensitive oxide semiconductor transistor, a threshold voltage moves in a negative direction. In particular, at a specific gate voltage, that is, at a voltage corresponding to a threshold voltage when light is not incident on the light-sensitive oxide semiconductor transistor in the graphs of FIGS. 1A and 1B, a current ratio of drain currents when light is incident on and when light is not incident on the light-sensitive oxide semiconductor transistor is about $6(\log_{10}(10^{-7}/10^{-13}))$. Thus, the light-sensitive oxide semiconductor transistor may be used as an optical sensor having a significantly high sensitivity due to such a great current ratio. In particular, the light-sensitive oxide semiconductor transistor may be used as an optical touch sensor of an optical touch panel according to example embodiments.

Figure 2:
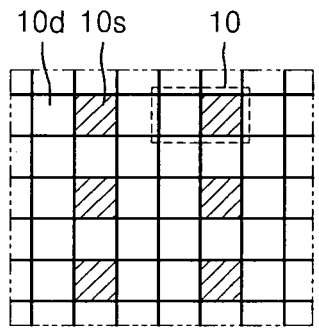
FIG. 2 illustrates an arrangement of pixels of an in-cell type touch screen panel in which a display pixel is integrated with an optical touch sensor, according to example embodiments.

In addition, the light-sensitive oxide semiconductor transistor may be configured as a thin film transistor (TFT) structure. Thus, similarly to a TFT for driving a display pixel, the light-sensitive oxide semiconductor transistor may be used in an in-cell type touch screen panel in which a display pixel is integrated with an optical touch sensor. FIG. 2 illustrates an arrangement of pixels of an in-cell type touch screen panel in which a display pixel is integrated with an optical touch sensor, according to example embodiments. Referring to FIG. 2, a plurality of pixels 10 may be arranged in a two-dimensional array in a touch screen panel. A display pixel unit 10d for displaying an image and an optical sensor unit 10s for sensing incident light may be formed together in at least a part of the plurality of pixels 10. According to example embodiments, the display pixel unit 10d and the optical sensor unit 10s may be disposed in each of the plurality of pixels 10. However, the optical sensor unit 10s may be disposed only in some of the pixels 10 in order to increase a resolution of a display device. In general, since the cross-sectional area of a light beam incident on the optical touch panel for controlling an optical touch is larger than the size of the single pixel 10, even though the optical sensor unit 10s is disposed only in some of the pixels 10 as illustrated in FIG. 2, it is possible to accurately specify the location where light is incident.

Figure 3:
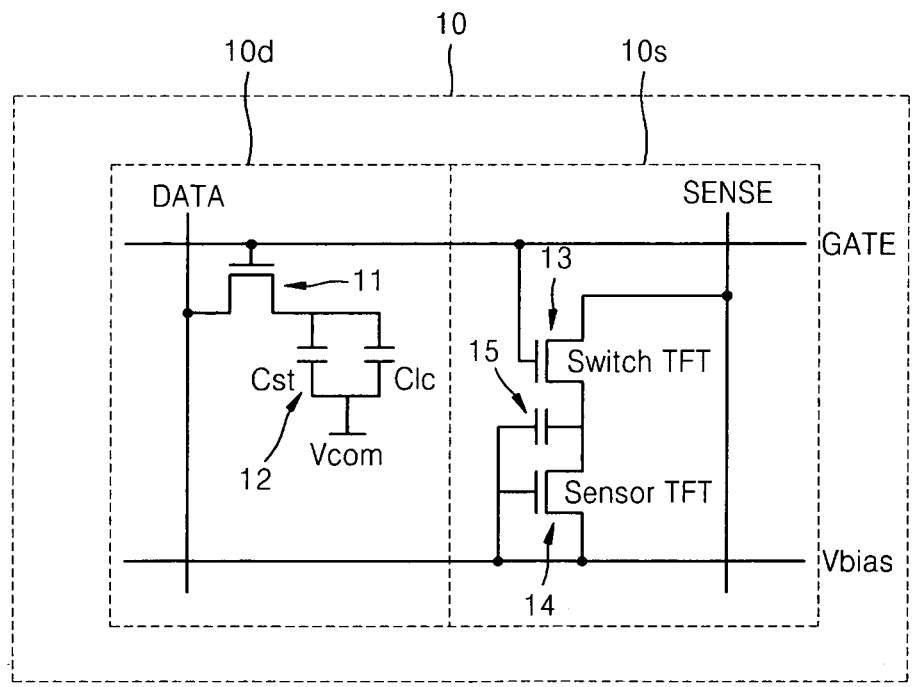
FIG. 3 illustrates a circuit structure of a pixel in which a display pixel unit is integrated with an optical sensor unit in the touch screen panel of FIG. 2.

FIG. 3 illustrates a circuit structure of the pixel 10 in which the display pixel unit 10d is integrated with the optical sensor unit 10s in the touch screen panel of FIG. 2. Referring to FIG. 3, the display pixel unit 10d may include a liquid crystal cell 12 and a first switch TFT 11 for controlling on/off of the liquid crystal cell 12. The optical sensor unit 10s may include an optical sensor TFT 14 for sensing incident light, a second switch TFT 13 for drawing data from the optical sensor TFT 14, and a capacitor 15. In example embodiments, gates of the first and second switch TFTs 11 and 13 may be connected to a gate line GATE. A drain of the first switch TFT 11 may be connected to a data line DATA, and a source of the first switch TFT 11 may be connected to the liquid crystal cell 12. A drain of the second switch TFT 13 may be connected to a sense line SENSE, and a source of the second switch TFT 13 may be connected to a drain of the optical sensor TFT 14. Both a gate and a source of the optical sensor TFT 14 may be connected to a bias voltage line Vbias. In example embodiments, an end of the capacitor 15 may be connected between the second switch TFT 13 and the optical sensor TFT 14, and another end of the capacitor 15 and a gate of the optical sensor TFT 14 together may be connected to the bias voltage line Vbias.

A process of sensing light incident on the optical sensor TFT 14 may be performed as follows. First, after the second switch TFT 13 is turned on, a reference voltage Vref is charged to the capacitor 15 via the sense line SENSE. After the charging of the reference voltage Vref is finished, the second switch TFT 13 is turned off. In this state, when light is incident on the optical sensor TFT 14, a threshold voltage of the optical sensor TFT 14 moves in a negative direction, and the optical sensor TFT 14 is turned on at the same time. Then, a current flows between the source and the drain of the optical sensor TFT 14, and a discharge occurs in the capacitor 15. If light is stopped from being incident on the optical sensor TFT 14, the threshold voltage of the optical sensor TFT 14 returns to its former condition. Thus, the optical sensor TFT 14 is turned-off, and no discharge occurs in the capacitor 15 any longer. Then, the second switch TFT 13 is turned on so as to read the amount of charges that remained in the capacitor 15, and thus it may be determined whether the optical sensor TFT 14 is exposed to light. For example, when the second switch TFT 13 is turned on, a current flows from the source of the second switch TFT 13, which is connected to the capacitor 15, to the sense line SENSE via the drain of the second switch TFT 13. The amount of the current flowing to the sense line SENSE varies according to the amount of charges that remained in the capacitor 15. Thus, the amount of charges that remained in the capacitor 15 can be measured from the amount of the current flowing to the sense line SENSE when the second switch TFT 13 is turned on.

FIG. 3 illustrates a relatively simple circuit structure of the optical sensor unit 10s for drawing data from the optical sensor TFT 14. However, in example embodiments, the optical sensor unit 10s may have a more complicated circuit structure. For example, the optical sensor unit 10s of FIG. 3 is illustrated as having only one switch TFT 13 and only one capacitor 15, however a more complicated and accurate data drawing circuit may be configured by using more switch TFTs 13. Such a data drawing circuit structure of the optical sensor unit 10s may be configured with reference to a driving circuit of a general image obtaining device.

In example embodiments, an optical sensor unit 10s may be integrated with a display pixel unit 10, as shown in FIGS. 2 and 3. However, in example embodiments, an additional optical touch panel, which may be separated from the display pixel unit 10d and may only include the optical sensor unit 10s, may be provided. In other words, example embodiments also provide for an optical touch panel including only the optical sensor unit 10s. In example embodiments, the optical touch panel including only the optical sensor unit 10s may be used by attaching it to an additional display including only the display pixel unit 10d.

Both the switch TFT 13 and the optical sensor TFT 14 of the optical sensor unit 10s may be oxide semiconductor transistors having the same structure including an oxide semiconductor as a channel material. However, the oxide semiconductor, which may be a channel material of the switch TFT 13, may be a material that is not sensitive to light, while the oxide semiconductor, which is a channel material of the optical sensor TFT 14, may be sensitive to light. For example, the switch TFT 13 may use gallium indium zinc oxide (GIZO), which is not sensitive to light, as a channel material. The optical sensor TFT 14, as described above, may use the ZnO-based oxide semiconductor material such as the indium zinc oxide (IZO) or other materials such as InO, SnO, ZnInO, ZnSnO and InSnO, which is sensitive to light, as a channel material. The channel materials of the switch TFT 13 and the optical sensor TFT 14 may be different from each other. However, a relatively simple and efficient method of fabricating the optical touch panel may form the switch TFT 13 and the optical sensor TFT 14 together on the same substrate.

FIGS. 4A through 4F are cross-sectional views illustrating a method of fabricating an optical touch panel for forming the switch TFT 13 and the optical sensor TFT 14 together on the same substrate, according to example embodiments. The method of fabricating the optical touch panel will be mainly described with respect to forming of the switch TFT 13 and the optical sensor TFT 14 together on the one substrate.

Figure 4A:
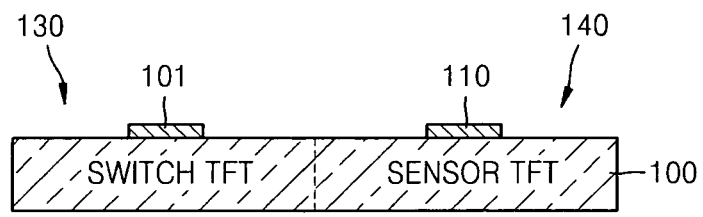
FIGS. 4A through 4F are cross-sectional views illustrating a method of fabricating an optical touch panel, according to example embodiments.

Referring to FIG. 4A, first and second gate patterns 101 and 110 may be respectively formed in a switch TFT region 130 and an optical sensor TFT region 140 that are formed on a substrate 100. In FIG. 4A, the first gate pattern 101 formed in the switch TFT region 130 may be a gate of the switch TFT 13, and the second gate pattern 110 formed in the optical sensor TFT region 140 may be a gate of the optical sensor TFT 14. The first and second gate patterns 101 and 110 may be formed of, for example, a conductive metal or a conductive metal oxide. In order to form the first and second gate patterns 101 and 110 on the substrate 100, the conductive metal or the conductive metal oxide material may be deposited on the entire surface of the substrate 100. Then, a mask (not shown) may be formed in each of the switch TFT region 130 and the optical sensor TFT region 140, and the rest of regions of the conductive metal or the conductive metal oxide material may be removed through etching.

Figure 4B:
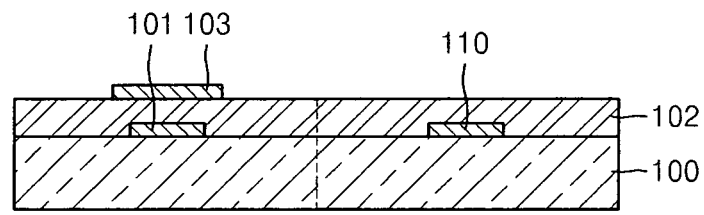

As illustrated in FIG. 4B, a gate insulating layer 102 may be coated on the entire substrate 100 and first and second gate patterns 101 and 110. The gate insulating layer 102 may be formed of a semiconductor oxide material, for example, $SiO_2$. A first channel layer 103 may be formed on the gate insulating layer 102 in the switch TFT region 130 so as to face the first gate pattern 101. The first channel layer 103 may become a channel layer of the switch TFT 13. The first channel layer 103 may be formed of an oxide semiconductor material that is not sensitive to light. For example, as described above, GIZO may be used as a material of the first channel layer 103. For example, the first channel layer 103 may be formed by forming the oxide semiconductor material, which is not sensitive to light, on the entire gate insulating layer 102 and then etching the oxide semiconductor material, except for the oxide semiconductor material formed in the switch TFT region 130.

Figure 4C:
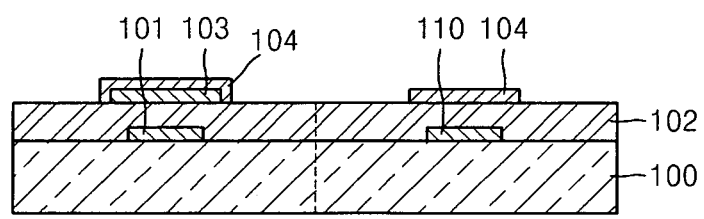

As illustrated in FIG. 4C, a second channel layer 104 may be formed on the gate insulating layer 102 in the optical sensor TFT region 140 so as to face the second gate pattern 110. The second channel layer 104 may partially remain in the switch TFT region 130 so as to surround at least an upper surface of the first channel layer 103. The second channel layer 104 may be formed in the optical sensor TFT region 140 and may become a channel layer of the optical sensor TFT 14. The second channel layer 104 may be formed of an oxide semiconductor material that is sensitive to light. For example, as described above, IZO may be used as a material of the second channel layer 104. For example, the second channel layer 104 may be formed by forming the oxide semiconductor material, which is sensitive to light, on the entire gate insulating layer 102 and first channel layer 103, and then etching the oxide semiconductor material, except for the oxide semiconductor material formed in the switch TFT region 130 and the optical sensor TFT region 140.

Figure 4D:
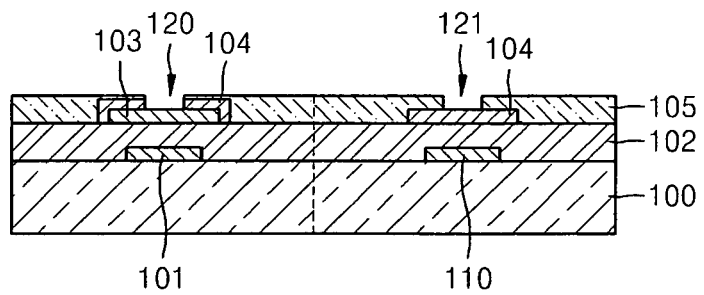

Referring to FIG. 4D, a source/drain pattern 105 may be formed at both sides of the first channel layer 103 and at both sides of the second channel layer 104. The source/drain pattern 105 may become a source and drain electrode of the switch TFT 13 and the optical sensor TFT 14. The source/drain pattern 105 may be formed of a conductive metal or a conductive metal oxide. As illustrated in FIG. 4D, the source/drain pattern 105 may be formed between the switch TFT region 130 and the optical sensor TFT region 140 and may electrically connect the first channel layer 103 of the switch TFT region 130 and the second channel layer 104 of the optical sensor TFT region 140. For example, the source/drain pattern 105 may be formed by depositing a conductive metal or a conductive metal oxide on the entire gate insulating layer 102 and first and second channel layers 103 and 104 and then partially removing the conductive metal or the conductive metal oxide deposited on the first and second channel layers 103 and 104. A part of the second channel layer 104 may be removed to form a first hole 120 in the switch TFT region 130, thereby exposing the surface of the first channel layer 103. In addition, the surface of the second channel layer 104 may be exposed to the outside by a second hole 121 that may be formed in the optical sensor TFT region 140. As a result, the source/drain pattern 105 may partially cover the first channel layer 103 and the second channel layer 104, and central portions of the upper surfaces of the first channel layer 103 and second channel layer 104 may be exposed to the outside.

Figure 4E:
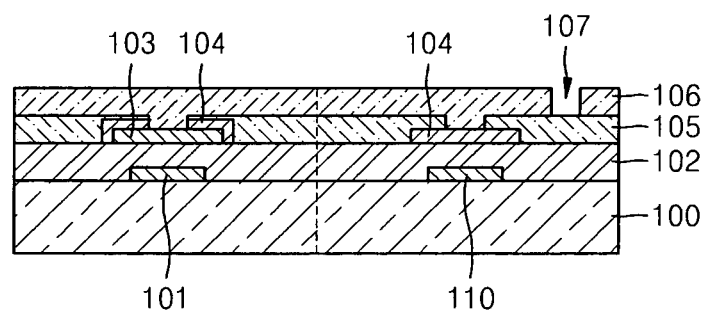
Figure 4F:
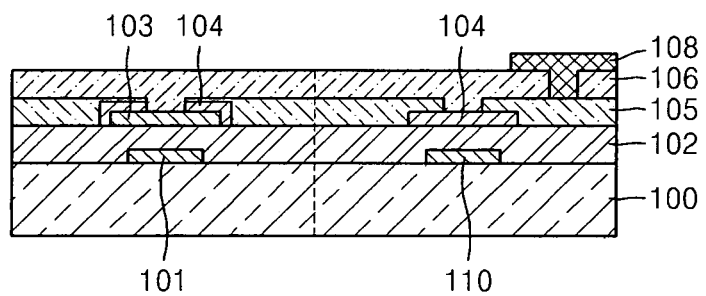

Referring to FIG. 4E, a transparent insulating layer 106 may be formed on the entire source/drain pattern 105 and the exposed portions of the first channel layer 103 and second channel layer 104. The transparent insulating layer 106 may be formed of a transparent insulating material so that light is incident on the second channel layer 104. For example, the transparent insulating layer 106 may be formed of $SiO_2$. As illustrated in FIG. 4E, a via hole 107 may be formed by etching the transparent insulating layer 106 so as to expose the source/drain pattern 105 formed in the optical sensor TFT region 140. As illustrated in FIG. 4F, a contact 108 may be formed by filling a conductive, metal or a conductive metal oxide material in the via hole 107. The contact 108 may connect a source of the optical sensor TFT 14 to the bias voltage line Vbias. Thus, the switch TFT 13 may be formed on the substrate 100 in the switch TFT region 130, and the optical sensor TFT 14 may be formed in the optical sensor TFT region 140.

The switch TFT 13 and the optical sensor TFT 14 of the optical touch panel may be formed on the substrate 100 through the above-described method. According to the method described in FIGS. 4A through 4F, the switch TFT 13 may have a double channel layer structure in which the first channel layer 103, which may not be sensitive to light, and the second channel layer 104, which may be sensitive to light, may be formed. However, because the second channel layer 104, which may be sensitive to light, may be covered by the source/drain pattern 105, the second channel layer 104 in the switch TFT region 130 may not be affected by light. Thus, the switch TFT 13 may have a relatively constant threshold voltage regardless of whether light is emitted thereto or not.

FIGS. 5A through 5F are cross-sectional views illustrating a method of fabricating an optical touch panel including a switch TFT 13 and an optical sensor TFT 14 that are formed on the same substrate, according to example embodiments. Compared to the method described in FIGS. 4A through 4F, in the method described in FIGS. 5A through 5F, only the formation sequence of a first channel layer 103 and a second channel layer 104 is reversed. Thus, the same description as presented with regard to the method described in FIGS. 4A through 4F will be omitted below.

Figure 5A:
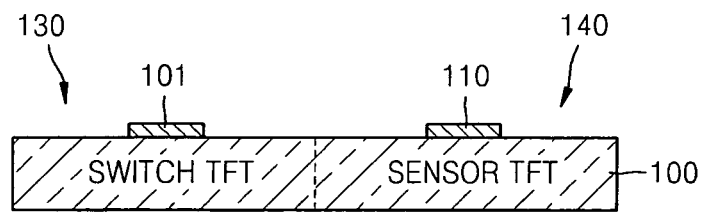
FIGS. 5A through 5F are cross-sectional views illustrating a method of fabricating an optical touch panel, according to example embodiments.
Figure 5B:
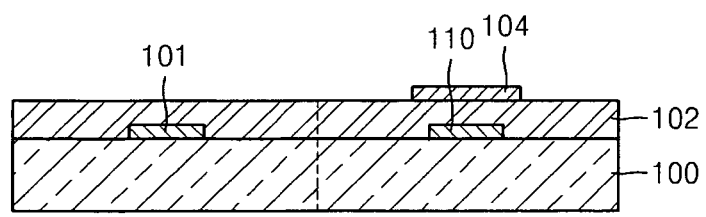

Referring to FIG. 5A, first and second gate patterns 101 and 110 are respectively formed in a switch TFT region 130 and an optical sensor TFT region 140 that are formed on a substrate 100. In FIG. 5A, the first gate pattern 101 formed in the switch TFT region 130 may be a gate of the switch TFT 13, and the second gate pattern 110 formed in the optical sensor TFT region 140 may be a gate of the optical sensor TFT 14. As illustrated in FIG. 5B, a gate insulating layer 102 may be coated on the entire substrate 100 and first and second gate patterns 101 and 110. The second channel layer 104 may be formed on the gate insulating layer 102 in the optical sensor TFT region 140 so as to face the second gate pattern 110. As described above, the second channel layer 104 may become a channel layer of the optical sensor TFT 14. Accordingly, the second channel layer 104 may be formed of an oxide semiconductor material that is sensitive to light, for example, IZO.

Figure 5C:
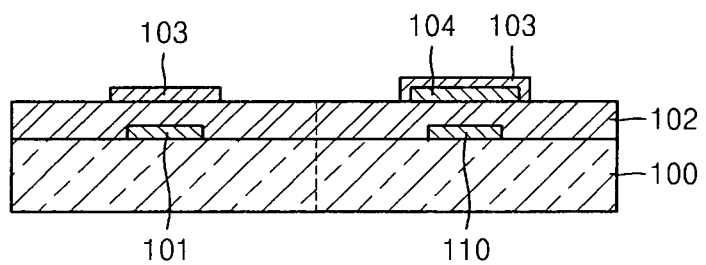

As illustrated in FIG. 5C, the first channel layer 103 may be formed on the gate insulating layer 102 in the switch TFT region 130 so as to face the first gate pattern 101. The first channel layer 103 may partially remain in the optical sensor TFT region 140 so as to surround at least an upper surface of the second channel layer 104. Because the first channel layer 103 may be formed in the switch TFT region 130 and because the first channel layer 103 may become a channel layer of the switch TFT 13, the first channel layer 103 may be formed of an oxide semiconductor material that is not sensitive to light, for example, GIZO.

Figure 5D:
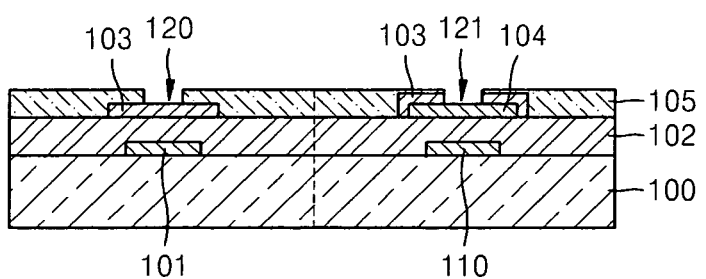

As illustrated in FIG. 5D, a source/drain pattern 105 may be formed at both sides of the first channel layer 103 and at both sides of the second channel layer 104. The source/drain pattern 105 may become a source and drain electrode of the switch TFT 13 and the optical sensor TFT 14. For example, the source/drain pattern 105 may be formed by depositing a conductive metal or a conductive metal oxide on the entire gate insulating layer 102 and first and second channel layers 103 and 104 and then partially removing the conductive metal or the conductive metal oxide deposited on the first and second channel layers 103 and 104. A part of the first channel layer 103 may be removed in a second hole 121 that may be formed in the optical sensor TFT region 140, thereby exposing the surface of the second channel layer 104. In addition, the surface of the first channel layer 103 may be exposed to the outside by a first hole 120 that may be formed in the switch TFT region 130.

Figure 5E:
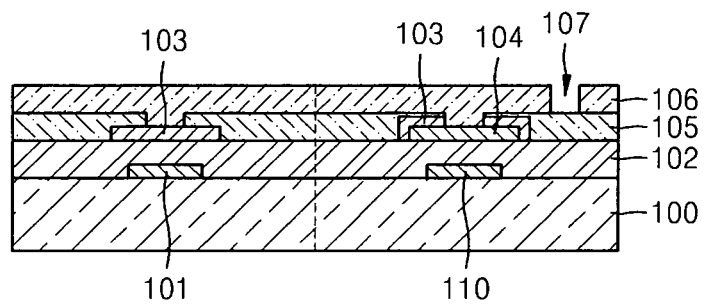
Figure 5F:
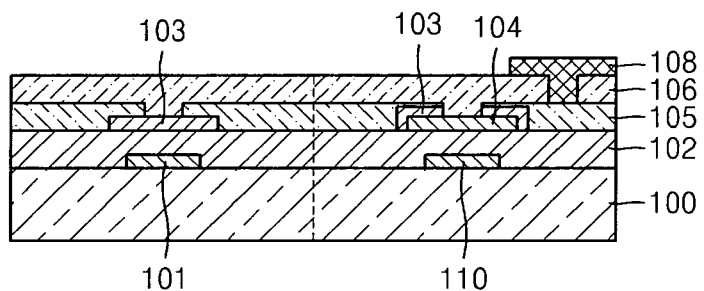

Referring to FIG. 5E, a transparent insulating layer 106 may be formed on the source/drain pattern 105 and the exposed portions of the first channel layer 103 and second channel layer 104. As illustrated in FIG. 5F, a contact 108 may be formed by filling a conductive metal or a conductive metal oxide material in the via hole 107.

The switch TFT 13 and the optical sensor TFT 14 of the optical touch panel may be easily formed on the substrate 100 through the above-mentioned method. According to the method described in FIGS. 5A through 5F, the optical sensor TFT 14 may have a double channel layer structure in which the second channel layer 104, which may be sensitive to light, and the first channel layer 103, which may not be sensitive to light, are formed. However, the first channel layer 103, which may not be sensitive to light, may be covered by the source/drain pattern 105, and the second channel layer 104, which may be sensitive to light, may be exposed to the outside. Thus, an electrical property of the optical sensor TFT 14 may be determined mainly by the second channel layer 104. That is, a threshold voltage of the optical sensor TFT 14 may vary according to whether light is incident thereon or not.

FIGS. 6A through 6G are cross-sectional views illustrating a method of fabricating an optical touch panel including a switch TFT 13 and an optical sensor TFT 14 that are formed on the same substrate, according to example embodiments. In description about FIGS. 6A through 6G, repeated description with regard to the above-described method will be omitted below.

Figure 6A:
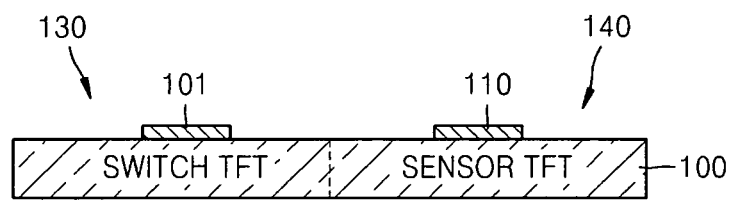
FIGS. 6A through 6G are cross-sectional views illustrating a method of fabricating an optical touch panel, according to example embodiments.
Figure 6B:
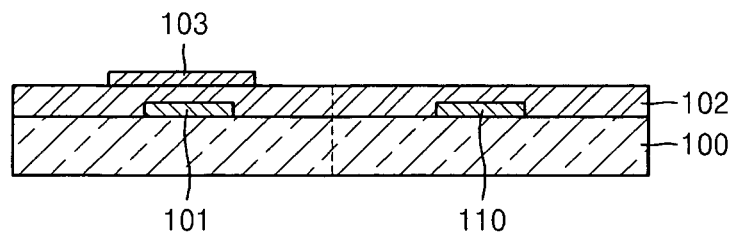

Referring to FIG. 6A, first and second gate patterns 101 and 110 are respectively formed in a switch TFT region 130 and an optical sensor TFT region 140 that are formed on a substrate 100. As illustrated in FIG. 6B, a gate insulating layer 102 may be coated on the entire substrate 100 and first and second gate patterns 101 and 1.10. A first channel layer 103 may be formed on the gate insulating layer 102 in the switch TFT region 130 so as to face the first gate pattern 101. Because the first channel layer 103 may become a channel layer of the switch TFT 13, the first channel layer 103 may be formed of an oxide semiconductor material that is not sensitive to light, for example, GIZO.

Figure 6C:
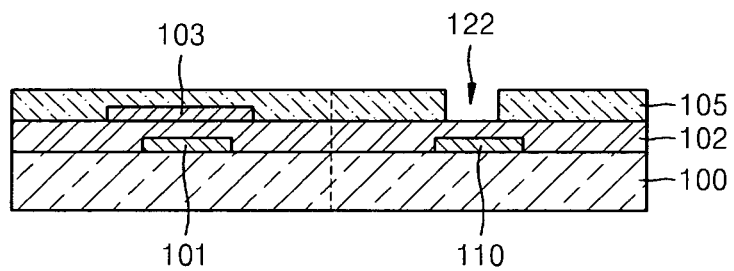

As illustrated in FIG. 6C, a source/drain pattern 105 may be formed on the entire gate insulating layer 102 and first channel layer 103. The source/drain pattern 105 may cover the entire surface of the first channel layer 103. A third hole 122 may be formed by etching a part of the source/drain pattern 105 formed in the optical sensor TFT region 140, wherein the third hole 122 may face the second gate pattern 110. Thus, in the optical sensor TFT region 140, a part of the gate insulating layer 102 may be exposed to the outside through the third hole 122.

Figure 6D:
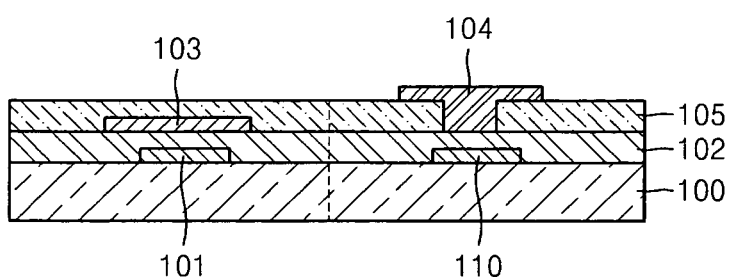

As illustrated in FIG. 6D, the third hole 122 may be filled with the second channel layer 104 that may be formed of an oxide semiconductor material that is sensitive to light, for example, IZO. The second channel layer 104 may extend to an upper surface of the source/drain pattern 105 around the third hole 122. As a result, the second channel layer 104 may be formed to penetrate the source/drain pattern 105. For this, the second channel layer 104 may be formed by the following process. For example, an oxide semiconductor material, which may be sensitive to light, may be coated on the entire source/drain pattern 105. A part of the oxide semiconductor material, which may be sensitive to light, may fill the third hole 122. A mask (not shown) may be formed in the optical sensor TFT region 140, and the rest of the oxide semiconductor material in which the mask is not formed may be etched, thereby forming the second channel layer 104 as illustrated in FIG. 6D. Thus, the source/drain pattern 105 may be separated to be disposed at both sides of the second channel layer 104.

Figure 6E:
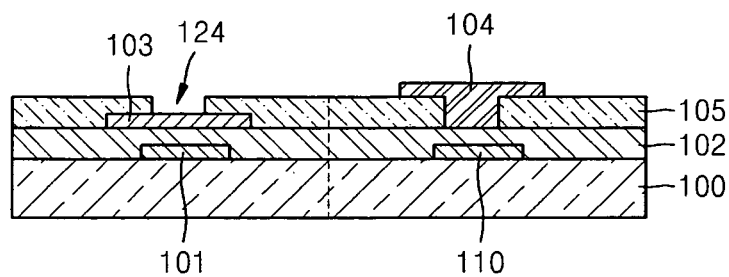

Referring to FIG. 6E, a fourth hole 124 may be formed by etching a part of the source/drain pattern 105 formed in the switch TFT region 130, thereby exposing a surface of the first channel layer 103 to the outside through the fourth hole 124. The source/drain pattern 105 formed on the first channel layer 103 may be partially removed, and thus the source/drain pattern 105 may be separated to be disposed at both sides of the first channel layer 103. As a result, the source/drain pattern 105 may cover both edges of the first channel layer 103, and a central portion of an upper surface of the first channel layer 103 is exposed to the outside.

Figure 6F:
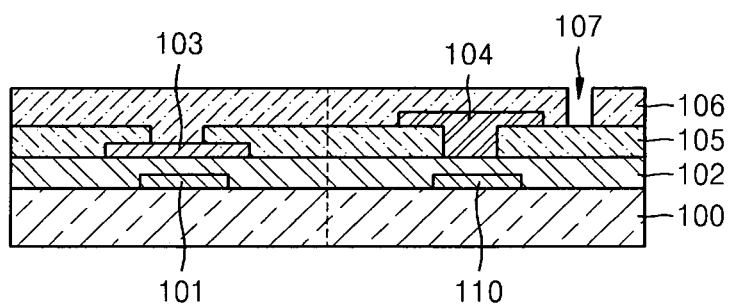
Figure 6G:
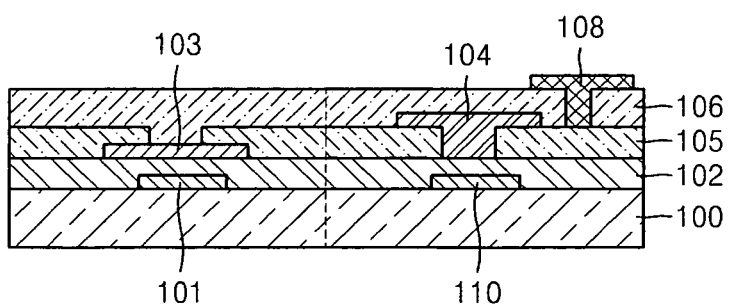

As illustrated in FIG. 6F, a transparent insulating layer 106 may be formed on the entire source/drain pattern 105 and first and second channel layers 103 and 104. As illustrated in FIG. 6G, a via hole 107 may be formed by etching the transparent insulating layer 106 so as to expose the source/drain pattern 105 formed in the optical sensor TFT region 140. A contact 108 may be formed by filling a conductive metal or a conductive metal oxide material in the via hole 107.

According to the above-described method, the switch TFT 13 may be formed on the substrate 100 in the switch TFT region 130, and the optical sensor TFT 14 may be formed on the same substrate 100 in the optical sensor TFT region 140. According to the method described in FIGS. 6A through 6G, both the switch TFT 13 and the optical sensor TFT 14 may have the channel layer having a single-layer structure. In particular, the second channel layer 104 of the optical sensor TFT 14 may be formed to be relatively wide, and thus, the optical sensor TFT 14 may have a relatively higher sensitivity.

FIGS. 7A through 7G are cross-sectional views illustrating a method of fabricating an optical touch panel including a switch TFT 13 and an optical sensor TFT 14 that are formed on the same substrate, according to example embodiments. Compared to the method described in FIGS. 6A through 6G, in the method described in FIGS. 7A through 7G, the formation sequence of a first channel layer 103 and a second channel layer 104 is reversed. Thus, the same description as presented with regard to the method described in FIGS. 6A through 6G will be omitted below.

Figure 7A:
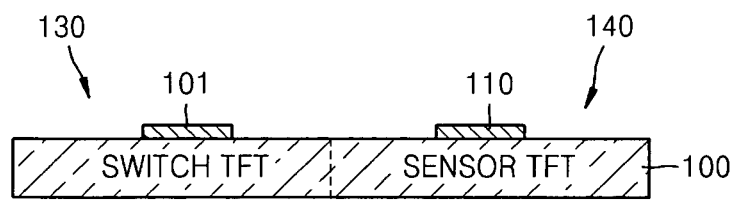
FIGS. 7A through 7G are cross-sectional views illustrating a method of fabricating an optical touch panel, according to example embodiments.
Figure 7B:
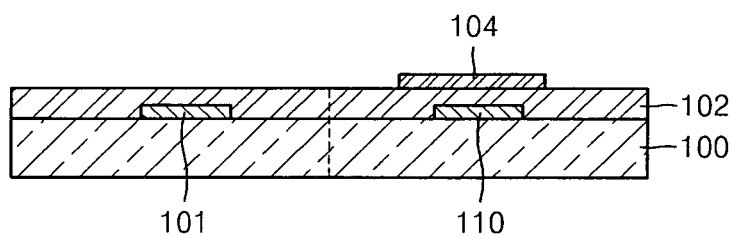

Referring to FIG. 7A, first and second gate patterns 101 and 110 may be respectively formed in a switch TFT region 130 and an optical sensor TFT region 140 that may be formed on a substrate 100. As illustrated in FIG. 7B, a gate insulating layer 102 may be coated on the entire substrate 100 and first and second gate patterns 101 and 110. The second channel layer 104 may be formed on the gate insulating layer 102 in the optical sensor TFT region 140 so as to face the second gate pattern 110. The second channel layer 104 may be formed of an oxide semiconductor material that is sensitive to light.

Figure 7C:
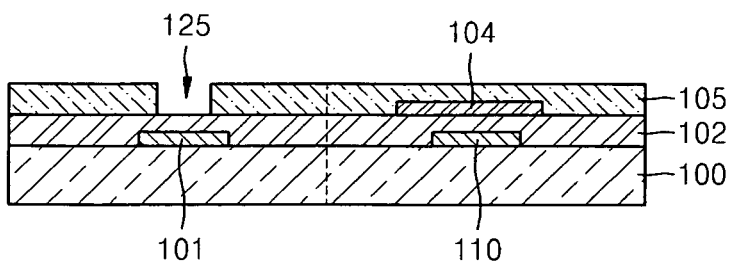

Referring to FIG. 7C, a source/drain pattern 105 may be formed on the entire gate insulating layer 102 and second channel layer 104. The source/drain pattern 105 may cover the entire second channel layer 104. A fifth hole 125 may be formed by etching a part of the source/drain pattern 105 formed in the switch TFT region 130, wherein the fifth hole 125 may face the first gate pattern 101. Thus, in the switch TFT region 130, a part of the gate insulating layer 102 may be exposed to the outside through the fifth hole 125.

Figure 7D:
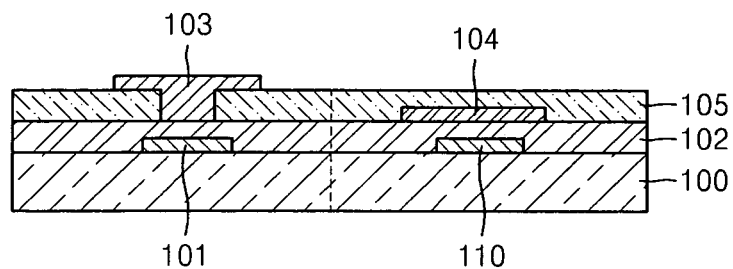
Figure 7E:
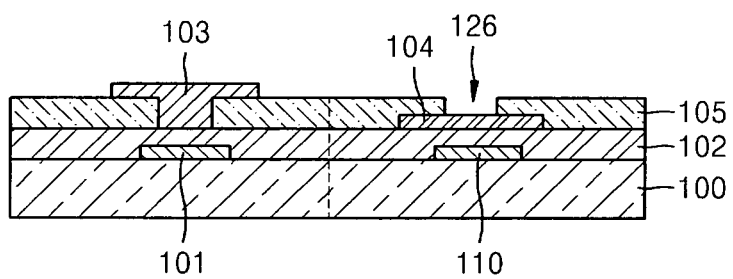

As illustrated in FIG. 7D, the fifth hole 125 may be filled with the first channel layer 103 formed of an oxide semiconductor material that is not sensitive to light. The first channel layer 103 may extend to an upper surface of the source/drain pattern 105 around the fifth hole 125, thereby forming the first channel layer 103. Thus, the source/drain pattern 105 may be separated to be disposed at both sides of the first channel layer 103. Referring to FIG. 7E, a sixth hole 126 may be formed by etching a part of the source/drain pattern 105 formed in the optical sensor TFT region 140. A part of the second channel layer 104 may be exposed to the outside through the sixth hole 126. The source/drain pattern 105 formed on the second channel layer 104 may be partially removed, and thus the source/drain pattern 105 may be separated so as to be disposed at both sides of the second channel layer 104.

Figure 7F:
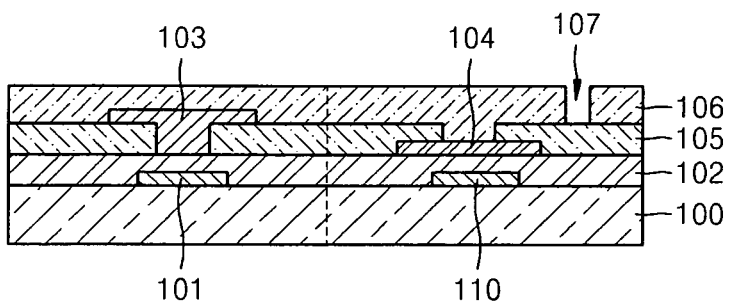
Figure 7G:
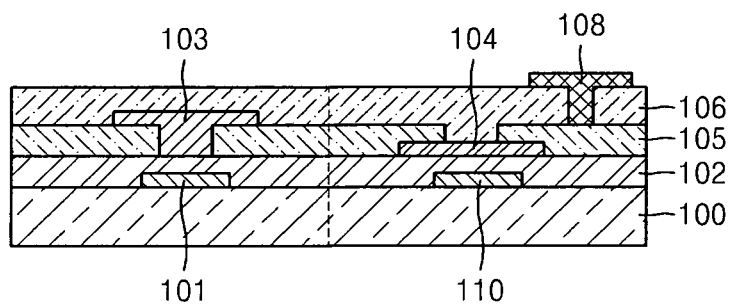

As illustrated in FIG. 7F, a transparent insulating layer 106 may be formed on the entire source/drain pattern 105 and first and second channel layers 103 and 104. As illustrated in FIG. 7F, a via hole 107 may be formed by etching the transparent insulating layer 106 so as to expose the source/drain pattern 105 formed in the optical sensor TFT region 140. A contact 108 (see FIG. 8G) may be formed by filling a conductive metal or a conductive metal oxide material in the via hole 107. According to the above-described method, the switch TFT 13 may be formed on the substrate 100 in the switch TFT region 130, and the optical sensor TFT 14 may be formed on the same substrate 100 in the optical sensor TFT region 140.

The above-described method of fabricating the optical touch panel may be used to fabricate an in-cell type touch screen panel in which a display pixel may be integrated with an optical touch sensor, and also used to fabricate an optical touch panel separated from a display device. An optical touch panel separated from the display device may be used by attaching it to a surface of the display device. Thus, the substrate 100 and the gate insulating layer 102 may be formed of a transparent insulating material. The first and second gate patterns 101 and 110 and the source/drain pattern 105 may be formed of a transparent conductive material, for example, ITO.

Figure 8:
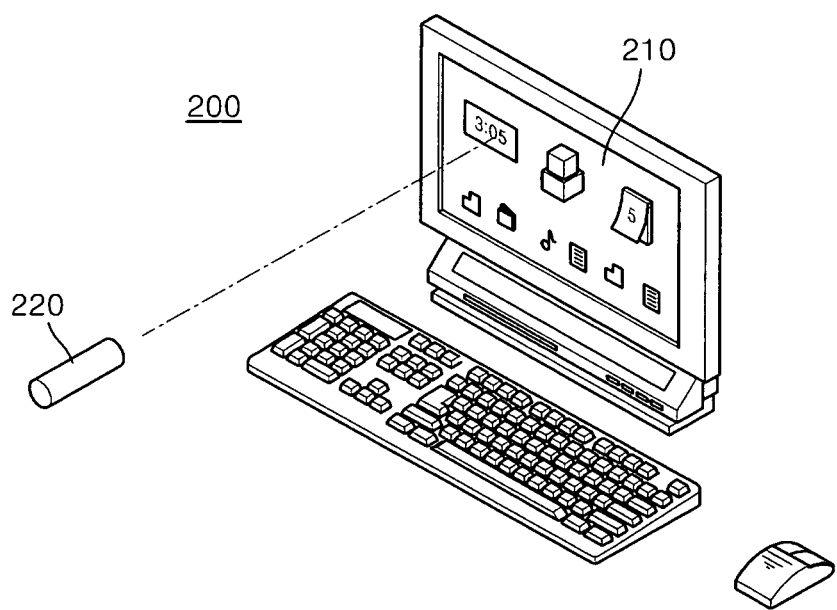
FIG. 8 is a schematic conceptual diagram illustrating an example for remotely controlling a display device via an optical source device by using an optical touch screen, according to example embodiments.

FIG. 8 is a schematic conceptual diagram illustrating an example for remotely controlling a display device via an optical source device by using the optical touch screen fabricated by the above-described method, according to example embodiments. FIG. 8 illustrates an optical touch screen device 200 including a display device 210 employing the above-described optical touch panel. The display device 210 may be a device in which an in-cell type optical touch panel is integrally formed in a display pixel. Also, an optical touch panel may be attached to a surface of the display device 210. In the optical touch screen device 200, when light is incident on the display device 210 using a simple optical source device 220, for example, a laser pointer, a plurality of optical sensors TFT 14 arranged in the optical touch panel sense the light. Thus, the same effect can be obtained as in the case where a human's hand or a pen touches a touch screen.

It should be understood that example embodiments described herein should be considered in a descriptive sense only and not for purposes of limitation. Descriptions of features or aspects within example embodiments should typically be considered as available for other similar features or aspects in other embodiments.

What is claimed is:

1. An optical touch panel comprising:
   an optical sensor transistor configured to sense light, the optical sensor transistor including a light sensitive oxide semiconductor material as a channel layer; and
   a switch transistor configured to draw data from the optical sensor transistor, the switch transistor including a non-light sensitive oxide semiconductor material as a channel layer, wherein the optical sensor transistor and the switch transistor are on a same substrate.

2. The optical touch panel of claim 1, wherein the optical touch panel comprises:
   a first gate pattern and a second gate pattern on the substrate;
   a gate insulating layer covering the substrate and the first and second gate patterns;
   a first channel layer on the gate insulating layer, the first channel layer facing the first gate pattern;
   a second channel layer on the gate insulating layer, the second channel layer facing the second gate pattern;
   a source/drain pattern at both sides of the first channel layer and at both sides of the second channel layer; and
   a transparent insulating layer covering the source/drain pattern and the first and second channel layers, wherein the second channel layer is configured to surround at least an upper surface of the first channel layer and expose the first channel layer.

3. The optical touch panel of claim 2, wherein the first channel layer facing the first gate pattern includes a light sensitive oxide semiconductor material as a channel layer of the optical sensor transistor, and the second channel layer facing the second gate pattern includes an non-light sensitive oxide semiconductor material as a channel layer of the switch transistor.

4. The optical touch panel of claim 3, wherein the light sensitive oxide semiconductor material includes ZnO, InO, SnO, ZnInO, ZnSnO, InSnO or their mixture with at least one material selected from the group consisting of Hf, Y, Ta, Zr, Ti, Cu, Ni, Cr, In, Ga, Al, Sn, Mg and Lanthanide, and the non-light sensitive oxide semiconductor material includes gallium indium zinc oxide (GIZO).

5. The optical touch panel of claim 2, wherein the first channel layer facing the first gate pattern includes a non-light sensitive oxide semiconductor material as a channel layer of the switch transistor and the second channel layer facing the second gate pattern includes a light-sensitive oxide semiconductor material as a channel layer of the optical sensor transistor.

6. The optical touch panel of claim 2, wherein the source/drain pattern partially covers upper surfaces of the first channel layer and the second channel layer, and a second channel layer is between the source/drain pattern and the first channel layer.

7. The optical touch panel of claim 1, wherein the optical touch panel comprises:
   a first gate pattern and a second gate pattern on the substrate;
   a gate insulating layer covering the substrate and the first and second gate patterns;
   a first channel layer on the gate insulating layer, the first channel layer facing the first gate pattern;
   a second channel layer on the gate insulating layer, the second channel layer facing the second gate pattern;
   a source/drain pattern at both sides of the first channel layer and at both sides of the second channel layer; and
   a transparent insulating layer covering the source/drain pattern and the first and second channel layers, wherein the source/drain pattern covers edges of the first channel layer, and the second channel layer extends to an upper surface of the source/drain pattern.

8. The optical touch panel of claim 7, wherein the first channel layer facing the first gate pattern includes a light sensitive oxide semiconductor material as a channel layer of the optical sensor transistor, and the second channel layer facing the second gate pattern includes a non-light sensitive oxide semiconductor material as a channel layer of the switch transistor.

9. The optical touch panel of claim 7, wherein the first channel layer facing the first gate pattern includes a non-light sensitive oxide semiconductor as a channel layer of the switch transistor, and the second channel layer facing the second gate pattern is a light sensitive oxide semiconductor material as a channel layer of the optical sensor transistor.

10. A method of fabricating an optical touch panel, the method comprising:
    forming first and second gate patterns on a substrate;
    forming a gate insulating layer on the substrate and the first and second gate patterns;
    forming a first channel layer on the gate insulating layer so as to face the first gate pattern;
    forming a second channel layer on the gate insulating layer in a location facing the second gate pattern and on at least an upper surface of the first channel layer;
    forming a source/drain pattern at both sides of the first channel layer and at both sides of the second channel layer; and
    forming a transparent insulating layer on the source/drain pattern and the first and second channel layers, wherein the first channel layer is formed of one of a light sensitive oxide semiconductor material and a non-light sensitive oxide semiconductor material, and the second channel layer is formed of the other one of the sensitive oxide semiconductor material and the non-light sensitive oxide semiconductor material.

11. The method of claim 10, wherein the light sensitive oxide semiconductor material includes ZnO, InO, SnO, ZnInO, ZnSnO, InSnO or their mixture with at least one material selected from the group consisting of Hf, Y, Ta, Zr, Ti, Cu, Ni, Cr, In, Ga, Al, Sn, Mg and Lanthanide, and the non-light sensitive oxide semiconductor material includes gallium indium zinc oxide (GIZO).

12. The method of claim 10, wherein forming the second channel layer includes
 forming a first layer of on the gate insulating layer and first channel layer; and
 removing the material layer except for portions facing the second gate pattern and portions facing at least an upper surface and side surfaces of the first channel layer on the gate insulating layer.

13. The method of claim 10, wherein the forming of the source/drain pattern comprises:
 forming one of a conductive metal and a conductive metal oxide on the gate insulating layer and first and second channel layers; and
 exposing an upper surface of the first channel layer and an upper surface of the second channel layer by partially removing the one of the conductive metal and the conductive metal oxide formed on the first and second channel layers.

14. The method of claim 13, wherein partially removing one of the conductive metal and the conductive metal oxide removes a part of the second channel layer formed on the first channel layer.

15. A method of fabricating an optical touch panel, the method comprising:
 forming first and second gate patterns on a substrate;
 forming a gate insulating layer on the substrate and first and second gate patterns;
 forming a first channel layer on the gate insulating layer so as to face the first gate pattern;
 forming a source/drain pattern on the gate insulating layer and first channel layer;
 forming a second channel layer so as to penetrate the source/drain pattern and to face the second gate pattern;
 exposing a surface of the first channel layer by partially removing the source/drain pattern formed on the first channel layer; and
 forming a transparent insulating layer on the source/drain pattern and first and second channel layers, wherein the first channel layer is formed of one of a light sensitive oxide semiconductor material and a non-light sensitive oxide semiconductor material, and the second channel layer is formed of the other one of the light sensitive oxide semiconductor material and the non-light sensitive oxide semiconductor material.

16. The method of claim 15, wherein forming the second channel layer includes
 forming a hole to expose the gate insulating layer by partially removing the source/drain pattern in a location facing the second gate pattern, and
 filling the second channel layer in the hole.

17. The method of claim 16, wherein the second channel layer extends to an upper surface of the source/drain pattern around the hole.

18. The method of claim 15, wherein the light sensitive oxide semiconductor material includes ZnO, InO, SnO, ZnInO, ZnSnO, InSnO or their mixture with at least one material selected from the group consisting of Hf, Y, Ta, Zr, Ti, Cu, Ni, Cr, In, Ga, Al, Sn, Mg and Lanthanide, and the non-light sensitive oxide semiconductor material includes gallium indium zinc oxide (GIZO).

19. The optical touch panel of claim 2, wherein the first channel layer and the second channel layer under the transparent insulating layer are not shielded from incident light.

* * * * *